US008806969B2

(12) United States Patent
Miyaji et al.

(10) Patent No.: US 8,806,969 B2
(45) Date of Patent: Aug. 19, 2014

(54) CERAMIC MEMBER, PROBE HOLDER, AND METHOD OF MANUFACTURING CERAMIC MEMBER

(75) Inventors: Shinya Miyaji, Kanagawa (JP); Shinji Saito, Kanagawa (JP)

(73) Assignee: NHK Spring Co., Ltd., Kanagawa (JP)

( * ) Notice: Subject to any disclaimer, the term of this patent is extended or adjusted under 35 U.S.C. 154(b) by 1174 days.

(21) Appl. No.: 12/309,537

(22) PCT Filed: Jul. 23, 2007

(86) PCT No.: PCT/JP2007/064457
§ 371 (c)(1),
(2), (4) Date: Jan. 22, 2009

(87) PCT Pub. No.: WO2008/013145
PCT Pub. Date: Jan. 31, 2008

(65) Prior Publication Data
US 2010/0000347 A1    Jan. 7, 2010

(30) Foreign Application Priority Data
Jul. 24, 2006  (JP) .................................. 2006-201250

(51) Int. Cl.
*C03C 10/00*  (2006.01)
*G01D 21/00*  (2006.01)

(52) U.S. Cl.
USPC ............................................. 73/866.5; 501/2

(58) Field of Classification Search
None
See application file for complete search history.

(56) References Cited

U.S. PATENT DOCUMENTS

| 6,144,212 A | 11/2000 | Mizuta |
| 2003/0091735 A1* | 5/2003 | Baumann et al. .............. 427/180 |
| 2005/0130829 A1* | 6/2005 | Etoh et al. ..................... 501/96.4 |

FOREIGN PATENT DOCUMENTS

| JP | 1-59231 | 9/1985 |
| JP | 61083619 A * | 4/1986 | .............. C01B 33/20 |
| JP | 62-78153 | 4/1987 |
| JP | 63-50365 | 3/1988 |
| JP | 06-040760 | 2/1994 |
| JP | 06-329466 | 11/1994 |
| JP | 11-125646 | 5/1999 |
| JP | 3697942 | 11/2000 |
| TW | 449845 B | 8/2001 |

OTHER PUBLICATIONS

Simetric, Mass, Weight, Density or Specific Gravity of Bulk Materials, last accessed Dec. 7, 2011.*
International Search Report mailed Oct. 23, 2007, issued on PCT/JP2007/064457.
Office Action mailed Apr. 14, 2009, issued on the corresponding Japanese application No. 2008-526760 and the English partial translation thereof.
Office Action mailed on Jul. 18, 2011.

* cited by examiner

*Primary Examiner* — Ellen S Raudenbush
*Assistant Examiner* — Anthony J Frost
(74) *Attorney, Agent, or Firm* — Edwards Wildman Palmer LLP; James E. Armstrong, IV; Stephen D. LeBarron (57) ABSTRACT

To provide a ceramic member having a thermal expansion coefficient close to that of silicon and has satisfactory workability, a probe holder formed by using this ceramic member, and a method of manufacturing the ceramic member. For this purpose, at least mica and silicon dioxide are mixed and an external force oriented in one direction is caused to act on this mixed mixture to sinter the mixture. It is more preferable that, in the mixture, a volume content of the mica is 70 to 90 volume % and a volume content of the silicon dioxide is 10 to 30 volume %.

3 Claims, 6 Drawing Sheets

CERAMIC MEMBER, PROBE HOLDER, AND METHOD OF MANUFACTURING CERAMIC MEMBER

TECHNICAL FIELD

The present invention relates to a ceramic member obtained by sintering a material having a predetermined composition, a probe holder that is formed by using this ceramic member and holds probes applied to electric characteristic inspection for a semiconductor integrated circuit and the like, and a method of manufacturing the ceramic member.

BACKGROUND ART

A thin plate-like probe holder having a large number of micro through-holes formed therein is incorporated in a micro contactor, which is used for semiconductor inspection and liquid crystal inspection, to insert probes that electrically connect a circuit structure of an inspection target and a circuit structure for transmitting a signal for inspection. In the past, a technology for forming this probe holder using ceramic members having free-cutting properties that can be machined (machinable ceramics) is disclosed (see, for example, Patent Document 1). Among such machinable ceramics, mica ceramics containing mica realize satisfactory workability through cleavage properties of the mica.

Patent Document 1: Japanese Patent No. 3697942

DISCLOSURE OF INVENTION

Problem to be Solved by the Invention

Whereas a thermal expansion coefficient of the mica ceramics is about $7.5 \times 10^{-6}$ to $11 \times 10^{-6}/°$ C., a thermal expansion coefficient of silicon is about $3.4 \times 10^{-6}/°$ C. The thermal expansion coefficients of the mica ceramics and the silicon are substantially different. Therefore, in the case of the probe holder made of the mica ceramics, when inspection in which inspection temperature changes from room temperature to high temperature such as burn-in inspection for a silicon wafer is performed, the inspection may be impossible because of the difference between the thermal expansion coefficients. This point is explained below.

As a specific example, a probe holder formed by using mica ceramics, a thermal expansion coefficient of which is $9 \times 10^{-6}/°$ C., is explained. It is assumed that a probe holder mounted on a micro contactor (a probe card) of a type for collectively bringing probes into contact with a wafer is formed and probe through-holes are designed to realize accurate contact at least under the room temperature.

When the burn-in inspection for a silicon wafer is performed by using the probe holder having the configuration explained above, a thermal expansion difference in an outer circumferential direction of about 120 to 130 μm occurs between the silicon wafer and the probe holder near an outer circumference of the silicon wafer during inspection under the temperature of 150° C. Therefore, depending on a temperature environment, in the probe holder made of the mica ceramics, tips of the probes housed in the probe holder do not accurately come into contact with electrode pads (usually having the size of about 80 μm square) provided on a wafer and inspection is impossible.

To solve the problem, a method of forming, with mica ceramics, a plurality of probe holders in which positions of through holes for inserting probes are slightly different for each of inspection temperature ranges is conceivable. However, in this case, micro contactors have to be replaced for each of the inspection temperature ranges. This causes an increase in inspection cost.

It is also conceivable to decide the positions of the through holes taking into account positional deviation due to the temperatures of the silicon wafer and the probe holders in advance. However, there is a problem in that the configuration is complicated and manufacturing cost increases because contrivance in design for deciding the positions is applied to the probe holders.

On the other hand, it is also conceivable to form mica ceramics containing a larger ratio of a glass material than that of the mica ceramics in the past explained above. The glass material has a thermal expansion coefficient of about $10^{-7}/°$ C. smaller than that of silicon. Therefore, a thermal expansion coefficient of the mica ceramics having the larger ratio of the glass material has a value closer to the thermal expansion coefficient of silicon than the thermal expansion coefficient of the mica ceramics in the past. However, in this case, a ratio of mica having cleavage properties is smaller than that in the past. Therefore, there is a new problem in that workability is deteriorated compared with that of the mica ceramics in the past.

As a material that can solve all the problems explained above, a technology for manufacturing a ceramic member having a thermal expansion coefficient close to that of silicon and having satisfactory workability has been long-expected.

The present invention has been devised in view of the above and it is an object of the present invention to provide a ceramic member having a thermal expansion coefficient close to that of silicon and having satisfactory workability, a probe holder formed by using this ceramic member, and a method of manufacturing the ceramic member.

Means for Solving Problem

A ceramic member according to an aspect of the present invention is formed by sintering a mixture containing mica and silicon dioxide, wherein the mica is oriented in one direction.

In the ceramic member, a thermal expansion coefficient at 20 to 250° C. in a direction parallel to a direction in which the mica may be oriented is $3 \times 10^{-6}$ to $5 \times 10^{-6}/°$ C.

In the ceramic member, in the mixture, a volume content of the mica may be 70 to 90 volume % and a volume content of the silicon dioxide is 10 to 30 volume %.

In the ceramic member, the mica may be non-swelling mica.

A probe holder according to another aspect of the present invention has through holes, into which probes made of a conductive material can be inserted, and houses the probes. The probe holder includes a base material formed by using the ceramic member according to the above invention, and the through-holes are pierced in a direction crossing a direction in which the mica is oriented in the base material.

A method of manufacturing a ceramic member according to still another aspect of the present invention includes mixing at least mica and silicon dioxide; causing external force oriented in one direction to act on a mixture obtained by the mixing; and sintering the mixture.

In the method, the causing the external force and the sintering may be collectively performed by a hot-press sintering method.

In the method, sintering temperature in the sintering may be 950 to 1000° C.

In the method, the sintering may be performed in a vacuum atmosphere or a reducing atmosphere.

In the method, in the mixture, a volume content of the mica may be 70 to 90 volume % and a volume content of the silicon dioxide is 10 to 30 volume %.

In the method, the mica may be non-swelling mica.

Effect of the Invention

According to the present invention, a mixture of mica and silicon dioxide is sintered and the mica is oriented in one direction. Therefore, it is possible to provide a ceramic member having a thermal expansion coefficient close to that of silicon and having satisfactory workability and a probe holder formed by using this ceramic member.

The method of manufacturing a ceramic member according to the present invention includes a mixing step of mixing at least mica and silicon dioxide, an external force acting step of causing external force oriented in one direction to act on a mixture mixed at the mixing step, and a sintering step of sintering the mixture. Therefore, it is possible to manufacture a ceramic member having a thermal expansion coefficient close to that of silicon and having satisfactory workability.

| EXPLANATIONS OF LETTERS OR NUMERALS | |
| --- | --- |
| 1 | probe holder |
| 1A, 1B | surfaces |
| 2 | probe card |
| 3 | probes |
| 4 | space transformer |
| 5 | interposer |
| 6 | wiring board |
| 7 | male connectors |
| 8 | reinforcing members |
| 9 | silicon wafer |
| 11 | through-holes |
| 11a | large-diameter sections |
| 11b | small-diameter sections |
| 31, 32 | needle-like members |
| 33 | spring members |
| 41, 91 | electrode pads |
| 101 | sintered compact |
| 102, 103 | test pieces |
| S | micro area |
| w | wiring |

BEST MODE(S) FOR CARRYING OUT THE INVENTION

Figure 1:
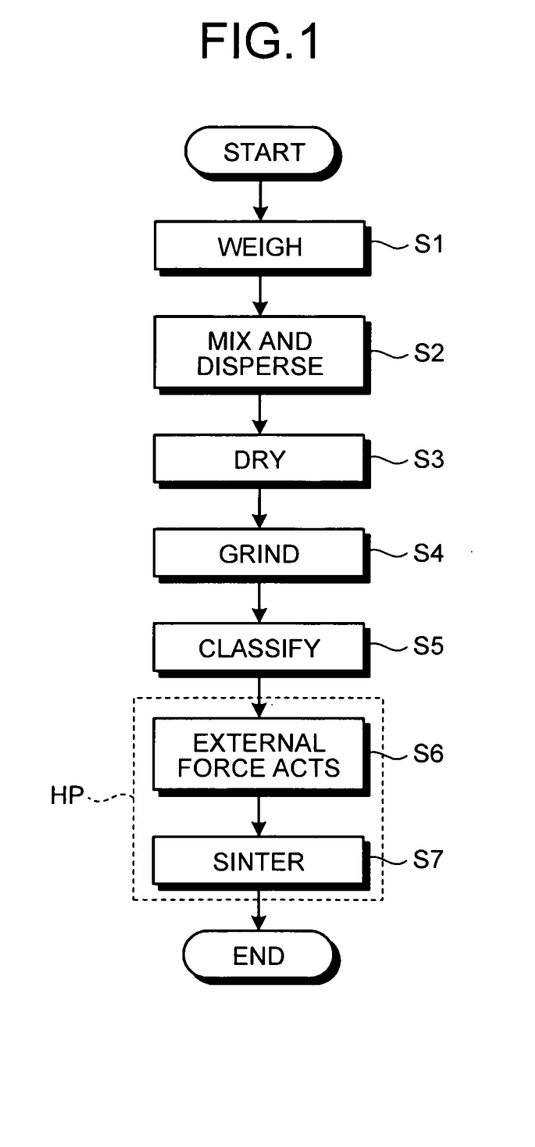
FIG. 1 is a flowchart of an overview of a method of manufacturing a ceramic member according to an embodiment of the present invention.

A best mode for carrying out the present invention (hereinafter, "embodiment") is explained below with reference to the accompanying drawings. FIG. 1 is a flowchart of an overview of a method of manufacturing a ceramic member according to an embodiment of the present invention. First, a row material containing mica and silicon dioxide ($SiO_2$) as main components is weighed (step S1). As the mica applied in this embodiment, non-swelling mica is suitable. However, it is also possible to apply other synthetic mica and natural mica.

Subsequently, mixing and dispersion of the material weighted at step S are performed (step S2). Specifically, the row material weighed at step S added with a solvent such as water or alcohol is mixed and dispersed by a wet-type ball mill. Subsequently, a mixture obtained at step S2 is put in an evaporator and dried to remove the solvent (step S3). Consequently, the mixture of mica and silicon dioxide changes to a flake-like aggregate. A volume content of mica in this mixture is 70 to 90 volume %. A volume content of silicon dioxide is 10 to 30 volume %.

Subsequently, the aggregate of the mixture obtained at step S3 is ground (step S4). At step S4, any one of a mortar and a dry-type ball mill or both are used according to a grain size distribution that should be attained after the grinding. Thereafter, the mixture is classified by using a mesh pass (step S5) to reduce an average grain diameter of the aggregate and uniformalize a grain size.

Thereafter, external force is caused to act in predetermined one direction on the mixture, the average grain diameter of which is reduced and the grain size of which is uniformalized (step S6) to sinter the mixture (step S7). In this embodiment, it is possible to apply a hot-press sintering method as a method of sintering the mixture. The hot-press sintering method is a method of putting the mixture in a frame of metal in a hot press device and sintering the mixture while pressing the mixture in predetermined one direction. Therefore, when the mixture is sintered by using the hot-press sintering method, the external force acting step at step S6 and the sintering step at step S7 are collectively performed (a step HP indicated by a broken line area shown in FIG. 1). Hot-press sintering temperature at this step HP is 900 to 1100° C. and, more preferably, 950 to 1000° C.

In general, mica particles assume a scaly shape. Therefore, scaly surfaces of the mica particles are aligned in a direction substantially orthogonal to an external force acting direction by causing external force oriented in one direction to act on the mica particles. As a result, the mixture is oriented in the direction orthogonal to the external force acting direction.

According to steps S1 to S7 explained above, a ceramic member according to this embodiment is completed. In the ceramic member manufactured in this way, orientation occurs in one direction because surface directions of the mica particles assuming the scaly shape are substantially aligned. As a result, in a sintered compact obtained by the sintering, whereas a thermal expansion coefficient in the external force acting direction is $12 \times 10^{-6}$ to $14 \times 10^{-6}$/° C., a thermal expansion coefficient in the orientation direction is $3 \times 10^{-6}$ to $5 \times 10^{-6}$/° C. Therefore, the thermal expansion coefficient in the orientation direction of the ceramic member is a value close to the thermal expansion coefficient $3.4 \times 10^{-6}$/° C. of silicon.

Figure 2:
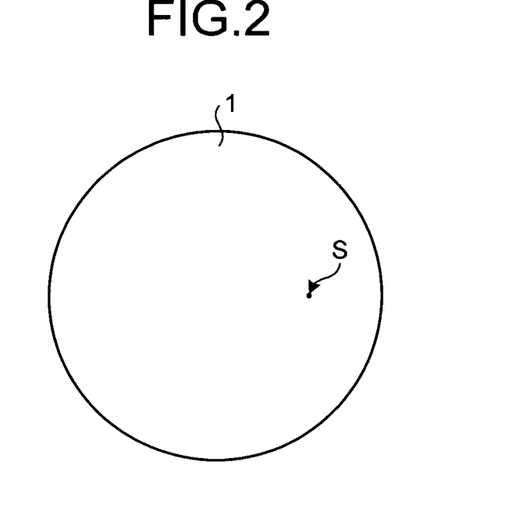
FIG. 2 is a diagram of a configuration of a probe holder formed by using the ceramic member according to the embodiment of the present invention.
Figure 3:
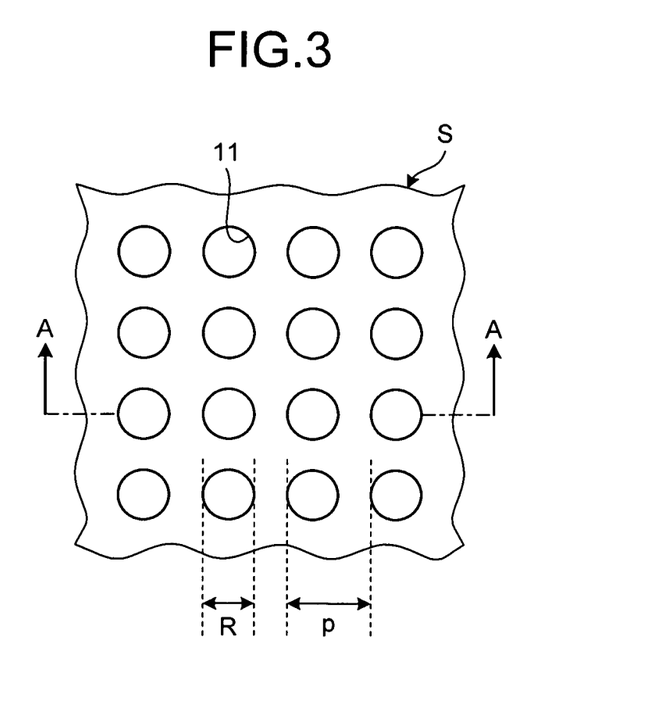
FIG. 3 is a partially enlarged diagram in which a micro area of the probe holder shown in FIG. 2 is enlarged.
Figure 4:
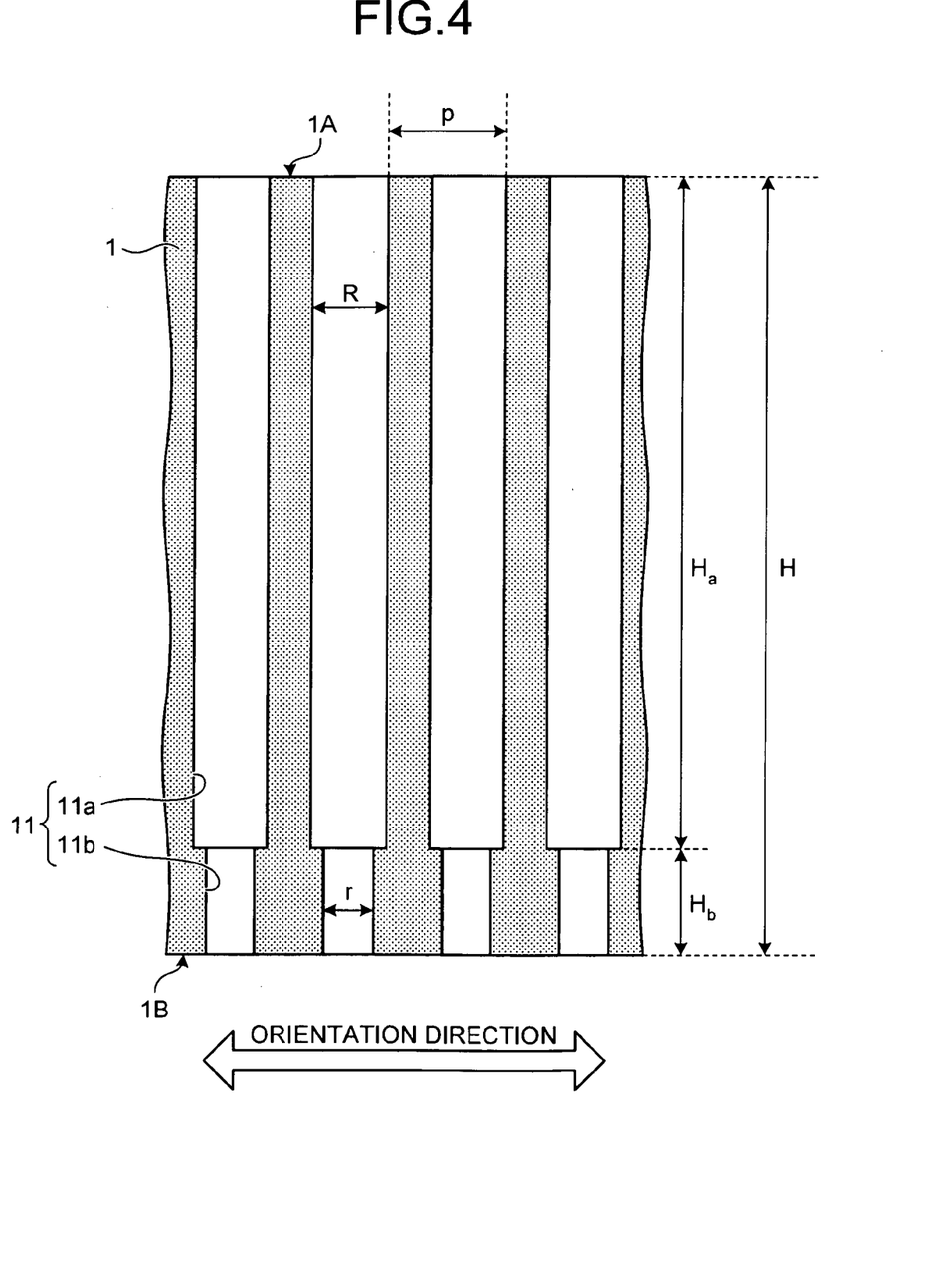
FIG. 4 is a sectional view taken along an A-A line in FIG. 3.

The ceramic member according to this embodiment electrically connects a circuit board such as a silicon wafer as an inspection target and a wiring board for transmitting a signal for inspection. Therefore, the ceramic member can be applied as a base material of a probe holder that holds probes formed by a conductive material. FIG. 2 is a diagram of a configuration of a probe holder according to this embodiment. FIG. 3 is a partially enlarged diagram in which a micro area S of a probe holder 1 shown in FIG. 2 is enlarged. FIG. 4 is a sectional view taken along A-A line in FIG. 3. It should be noted that the drawings are schematic drawings and relations between thicknesses and widths of sections, ratios of the thicknesses of the sections, and the like are different from real ones. It goes without saying that sections having different relations and ratios of dimensions thereof among the drawings may be included.

The probe holder 1 shown in FIGS. 2 to 4 is formed in a thin disc shape and forms a part of a probe card as a micro contactor applied to a full wafer level test for a silicon wafer (a configuration of the probe card is explained later). In the probe holder 1, through-holes 11 for housing probes arranged according to an array of a silicon wafer as an inspection target are formed in a thickness direction thereof (a vertical direction in FIG. 4). The through-holes 11 have large-diameter sections 11a drilled from a surface 1A, which is opposed to the wiring side for transmitting a signal for inspection, in the thickness direction and small-diameter sections 11b that has a center axis same as that of the large-diameter section 11a, have a diameter smaller than that of the large-diameter sections 11a, and are drilled from a surface 1B, which is opposed to the silicon wafer as the inspection target during inspection, in the thickness direction.

In the probe holder 1, an orientation direction of mica particles is orthogonal to the thickness direction of the probe holder 1, i.e., a piercing-through direction of the through-holes 11. Therefore, a thermal expansion coefficient in a horizontal direction in FIG. 4 is the same regardless of a coefficient of thermal expansion (in the horizontal direction) and temperature of the silicon wafer. As a result, the probe holder 1 can accurately bring the probes into contact with the silicon wafer regardless of temperature. The array direction of the mica particles in the probe holder 1 only has to cross the piercing-through direction of the through-holes 11. However, it is more preferable if the orientation direction is orthogonal to the piercing-through direction as explained above.

When the through-holes 11 are formed in the probe holder 1, after improving flatness and parallelism of a ceramic member using a surface grinder, the small-diameter sections 11b are formed to predetermined depth $H_b$ from the surface 1B and then the ceramic member is drilled to predetermined depth $H_a$ from the surface 1A to form the large diameter sections 11a ($H=H_a+H_b$). When the large-diameter sections 11a and the small-diameter sections 11b are formed, drilling is performed by using a carbide drill that matches various diameters. However, machining technologies such as laser, etching, punching molding, electron beam, ion beam, and wire discharge may be applied. With the ceramic member according to this embodiment, it is possible to realize machining for increasing an aspect ratio (a ratio $H_b/r$ of hole depth $H_b$ with respect to a diameter r) of the through-holes 11 to be equal to or larger than 15.

Figure 5:
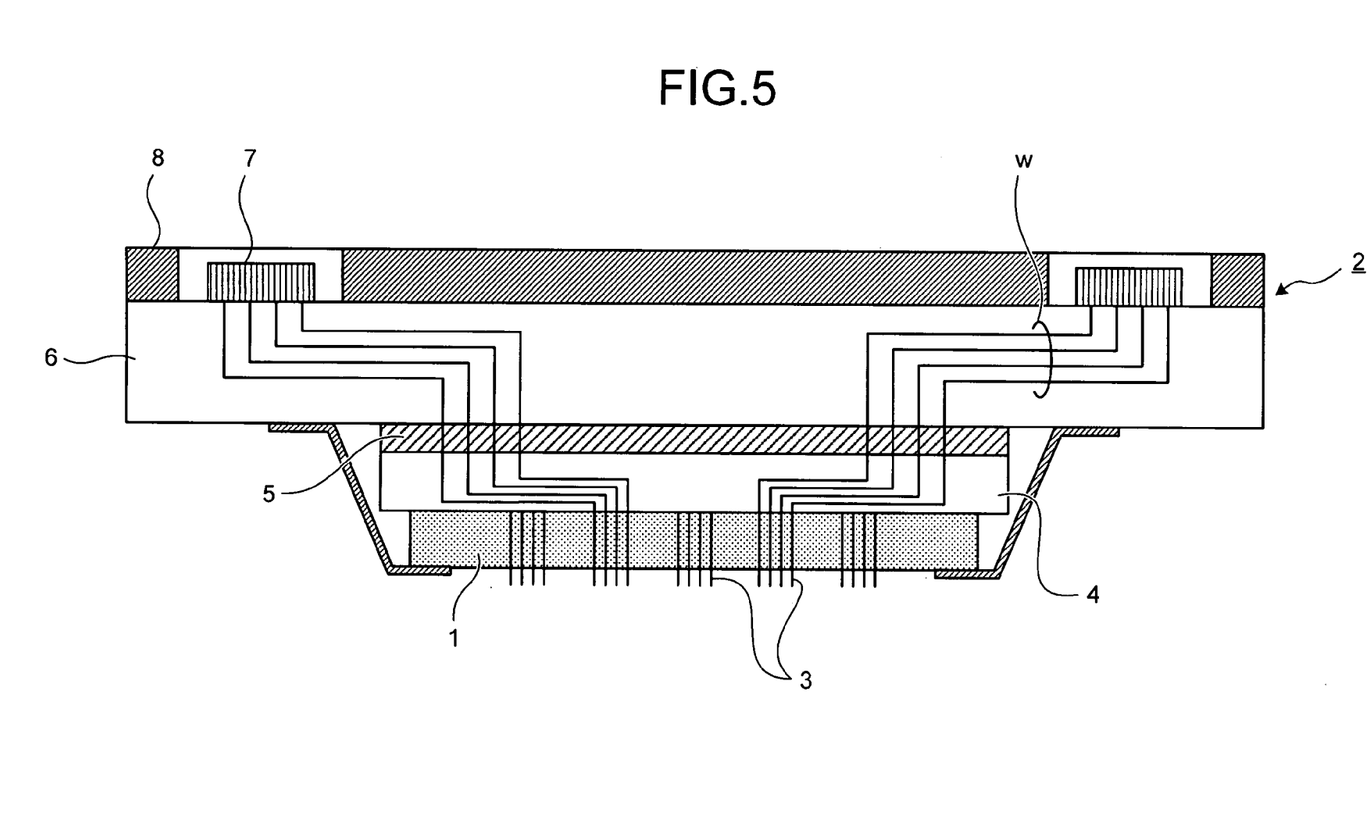
FIG. 5 is a schematic diagram of a configuration of a main part of a probe card configured by using the probe holder according to the embodiment of the present invention.

FIG. 5 is a schematic diagram of a configuration of a main part of a probe card configured by using the probe holder 1. A probe card 2 shown in the figure includes the probe holder 1 explained above, probes 3 housed and held in the through-holes 11 of the probe holder 1, a space transformer 4 that transforms an interval of micro wiring w in the probe holder 1, an interposer 5 that relays the wiring w sticking out of the space transformer 4, a wiring board 6 that connects the wiring w relayed by the interposer 5 to an inspection device, a male connector 7 provided on the wiring board 6 and provided on the inspection device side, and a reinforcing member 8 that reinforces the wiring board 6.

Figure 6:
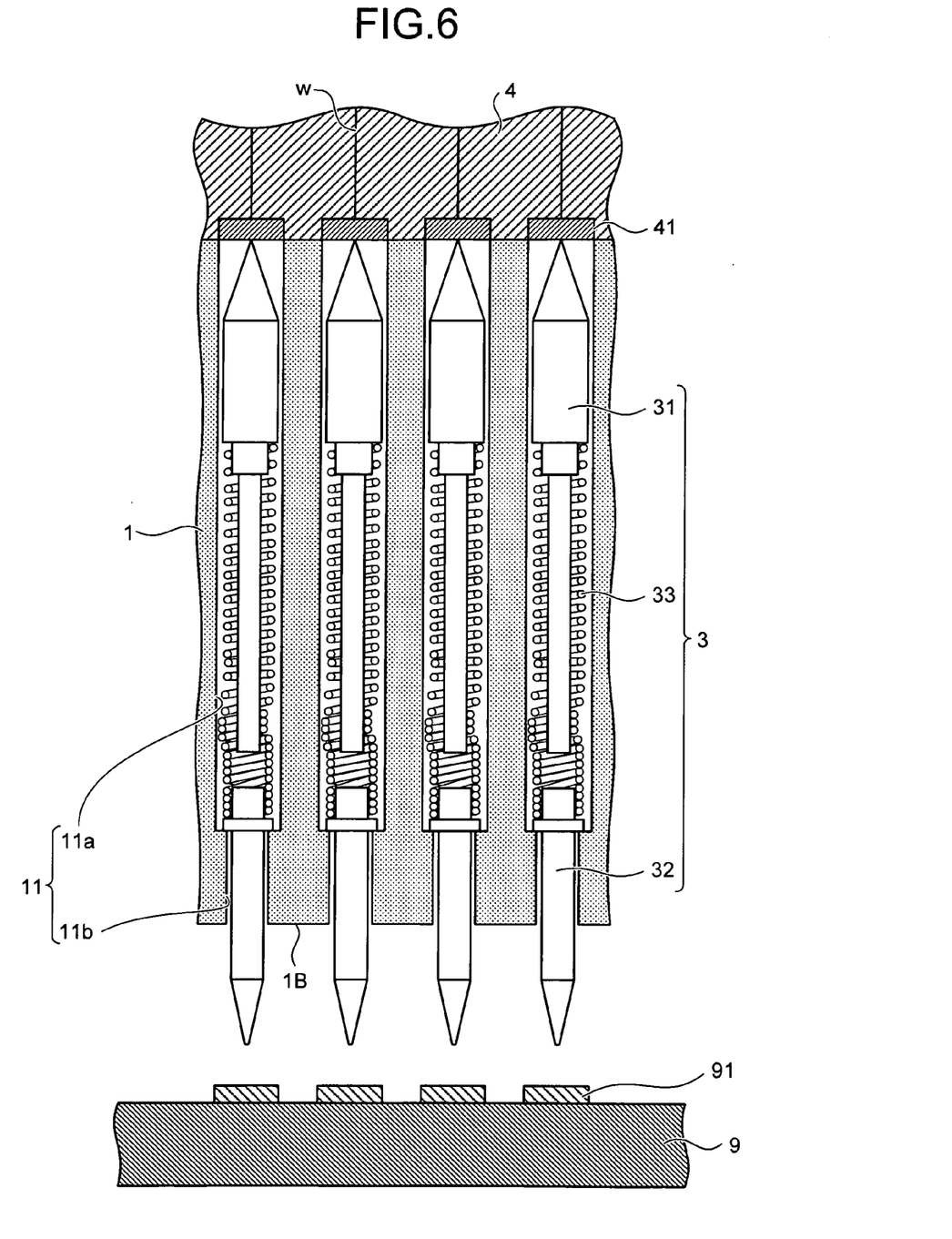
FIG. 6 is a diagram of a detailed configuration of probes and a form of holding the probes in the probe holder.

FIG. 6 is a diagram of a detailed configuration of the probes 3 and a form of holding the probes 3 in the probe holder 1. In each of the probes 3, a needle-like member 31, a tip of which comes into contact with an electrode pad 41 provided in the space transformer 4, a needle-like member 32 that projects from the surface 1B in a direction opposed to the needle-like member 31 and comes into contact with an electrode pad 91 of a silicon wafer 9, and a spring member 33 that is provided between the needle-like member 31 and the needle-like member 32 and stretchably couples the two needle-like members 31 and 32 are coaxially coupled. A flange is formed near a proximal end of the needle-like member 32 and is prevented from coming off by a step that forms a boundary between the small-diameter section 11b and the large-diameter section a of the through-hole 11. A specific array pattern in the probe holder 1 of the probes 3 is decided according to an arrangement pattern of the electrode pads 91 on the silicon wafer 9 as an inspection target.

The probe holder 1 does not cause halation on the surface of the probe holder 1 because the probe holder 1 has a black tint. Therefore, it is possible to improve detection accuracy and detection speed for the probes 3 and reduce time of inspection itself.

The probe holder 1 can be applied to electric characteristic inspection under various conditions. For example, the probe holder 1 can be applied not only to electric characteristic inspection under a condition that the temperature of the inspection target and the temperature of the ceramic member forming the base material of the probe holder 1 are equal but also to electric characteristic inspection under a condition that the temperature of the inspection target is higher than the temperature of the ceramic member.

According to the embodiment of the present invention explained above, the mixture containing mica, the volume content of which is 70 to 90 volume %, and silicon dioxide, the volume content of which is 10 to 30 volume %, is sintered and the mica is oriented in one direction. Therefore, it is possible to provide a ceramic member having a thermal expansion coefficient close to that of silicon and having satisfactory workability and a probe holder formed by using this ceramic member.

The method of manufacturing a ceramic member according to this embodiment includes the mixing step of mixing at least mica and silicon dioxide to thereby generate a mixture of the mica, the volume content of which is 70 to 90 volume %, and the silicon dioxide, the volume content of which is 10 to 30 volume %, the external force acting step of causing an external force oriented in one direction to act on the mixture containing, as main components, the mica and the silicon dioxide mixed in the mixing step, and the sintering step of sintering the mixture. Therefore, it is possible to manufacture a ceramic member having a thermal expansion coefficient close to that of silicon and having satisfactory workability.

With the probe holder according to this embodiment, because the inserting direction of the probes is orthogonal to the orientation direction of the mica particles, a change due to thermal expansion in positions with which the probes come into contact occurs following a change due to thermal expansion in the silicon wafer. Therefore, even when a plurality of kinds of inspection are performed under different temperature environments, it is possible to accurately bring the probes into contact with the electrode pads of the silicon wafer regardless of temperature. Therefore, because it is unnecessary to replace the probe holder according to a temperature band, it is possible to reduce inspection time and reduce cost required for inspection.

In addition, in this embodiment, the external force acting step and the sintering step are collectively performed by the hot-press sintering method. Therefore, it is possible to easily manufacture a ceramic member. In particular, in this embodiment, because sintering temperature is as high as about 950 to 1000° C., the generated ceramic member assumes a black tint. Therefore, the probe holder formed by using the ceramic member according to this embodiment does not cause halation on the surface when image processing is performed to detect positions of the probes in actual inspection. Therefore, it is possible to improve detection accuracy and detection speed for the positions of the probes.

The external force acting step and the sintering step in the method of manufacturing a ceramic member according to this embodiment are not limited to the hot-press sintering method. For example, a slip cast method can be applied as the external force acting step. When the slip cast method is applied, the mica particles settle and deposit in a die because of the gravity as the external force. Consequently, the mica particles are oriented. When an aggregate including the mica particles oriented in this way is sintered, a sintering method known in the past such as a vacuum sintering method or a reducing atmosphere sintering method only has to be applied. After the slip cast method is applied, the aggregate can be sintered by using the hot-press sintering method. When the hot-press sintering method is used, an orientation direction of the mica particles caused by the slip cast method and a pressure direction in the hot-press sintering method only have to be set orthogonal to each other.

The probe holder that can be manufactured from the ceramic member according to this embodiment is not limited to a full wafer type for collectively bringing the probes into contact with the electrode pads on the silicon wafer. The probe holder can be applied as a socket-type probe holder and the like as well. In the explanation of this embodiment, the probe holder that houses pin-type probes in which pins are coupled by spring members is used. However, the ceramic member explained above can also be applied as a probe holder that houses probes of other types (a wire type, a blade type, etc.).

Example 1

Examples of the present invention are explained. In Example 1 of the present invention, the method of manufacturing a ceramic member explained in the embodiment was used to generate a ceramic member from a mixture containing mica having a volume content of 80 volume %, and silicon dioxide having a volume content of 20 volume %, as main components. As the mica, non-swelling mica including potassium (K), magnesium (Mg), silicon (Si), oxygen (O), and fluorine (F) was applied.

In Example 1, the external force acting step and the sintering step were collectively performed by the hot-press sintering method. When the hot-press sintering was performed, the ceramic member was pressed in one direction at a surface pressure of 35 MPa in a nitrogen atmosphere of 600 mmHg and sintered at the sintering temperature 1000° C. for six hours. In a sintered compact obtained by this hot-press sintering, thermal expansion in a pressure direction during the hot-press sintering and thermal expansion in a direction perpendicular to this pressure direction were measured in a predetermined temperature band between the room temperature (20° C.) and 250° C. This measurement was performed according to JIS R 1618 (a method of measuring thermal expansion through a thermomechanical analysis for fine ceramics).

Figure 7:
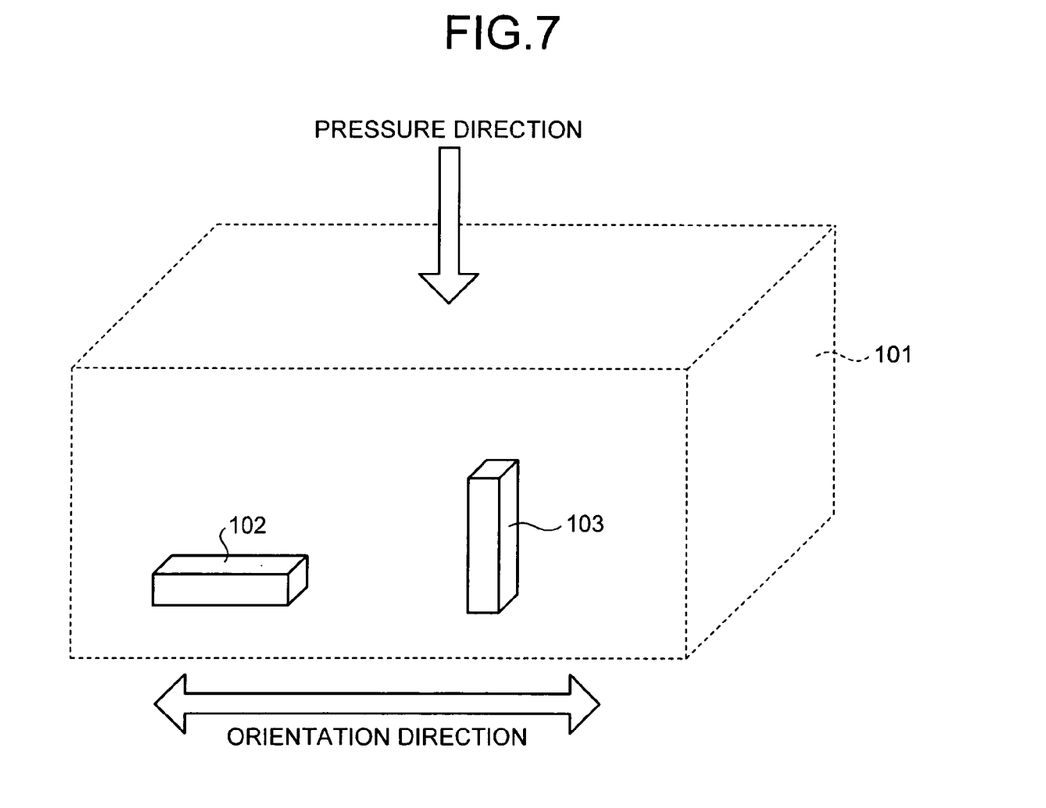
FIG. 7 is a diagram of test pieces used in measurement of thermal expansion performed in an example 1 of the present invention.

FIG. 7 is a schematic diagram of test pieces used for the measurement in the example 1. Specifically, a method of slicing test pieces from a sintered compact 101 (indicated by a broken line) is schematically shown. Of two test pieces 102 and 103 shown in the figure, the test piece 102 is manufactured as a test piece for thermal expansion measurement in an orientation direction. The test piece 103 is manufactured as a test piece for thermal expansion measurement in a pressure direction. In Table 1, a result of this measurement is shown for each of temperature bands. A lower limit of the temperature bands in Table 1 is the room temperature (about 20° C.).

[Table 1]

TABLE 1

| Temperature (° C.) | Thermal Expansion Coefficient ($10^{-6}$/° C.) | |
|---|---|---|
| | Orientation Direction | Pressure Direction |
| To 100 | 3.52 | 11.42 |
| To 150 | 3.41 | 11.46 |
| To 200 | 3.43 | 11.62 |
| To 250 | 3.78 | 12.06 |

It is seen from this Table 1 that the thermal expansion coefficient in the orientation direction of the ceramic member was $3.4 \times 10^{-6}$ to $3.8 \times 10^{-6}$/° C. in all the temperature bands and attained a value close to the thermal expansion coefficient of silicon ($3.4 \times 10^{-6}$/° C.). On the other hand, the thermal expansion coefficient in a direction parallel to the pressure direction was about $11 \times 10^{-6}$ to $12 \times 10^{-6}$/° C. As a result, it was made clear that anisotropy concerning a thermal expansion coefficient was developed in the ceramic member according to the example 1.

In Example 1, to check workability of a ceramic member, a ceramic member having thickness of 2.70 mm was formed from a sintered compact and five hundred through-holes were formed in a matrix shape in this ceramic member by drilling with a carbide drill. A diameter of the through-holes could be set to 160 μm (an aspect ratio was 2.70/0.160=16.9) and a hole pitch p could be set to 200 μm. As a result, ±5 μm could be attained as pitch accuracy. In this sense, it was confirmed that the ceramic member manufactured in Example 1 had satisfactory workability.

Example 2

In Example 2 of the present invention, the method of manufacturing a ceramic member explained in the embodiment was used to generate a ceramic member from a mixture containing mica, a volume content of which was 70 volume %, and silicon dioxide, a volume content of which was 30 volume %, as main components. In the example 2, non-swelling mica same as that in the example 1 was applied and sintering was performed by the hot-press sintering method. Sintering conditions during the hot-press sintering were the same as those in the example 1. As in the example 1, in a sintered compact obtained by the sintering, measurement conforming to JIS R 1618 was performed in different temperature bands. A measurement result is shown in Table 2.

[Table 2]

TABLE 2

| Temperature (° C.) | Thermal Expansion Coefficient ($10^{-6}$/° C.) | |
| --- | --- | --- |
|  | Orientation Direction | Pressure Direction |
| To 100 | 3.44 | 10.84 |
| To 150 | 3.42 | 10.91 |
| To 200 | 3.61 | 11.21 |
| To 250 | 3.73 | 11.40 |

It is seen from this Table 2 that the thermal expansion coefficient in the orientation direction of the ceramic member was $3.4 \times 10^{-6}$ to $3.7 \times 10^{-6}$/° C. in all the temperature bands and attained a value close to the thermal expansion coefficient of silicon ($3.4 \times 10^{-6}$/° C.). On the other hand, the thermal expansion coefficient in a direction parallel to the pressure direction was about $10 \times 10^{-6}$ to $12 \times 10^{-6}$/° C. Therefore, as in Example 1, it was made clear that anisotropy concerning a thermal expansion coefficient was developed in the ceramic member according to Example 2.

In Example 2, to check workability of a ceramic member, through-holes were formed as in Example 1. As a result, as in Example 1, it was confirmed that the ceramic member manufactured in Example 2 had workability equivalent to that of the ceramic member manufactured in Example 1.

Example 3

In Example 3 of the present invention, the method of manufacturing a ceramic member explained in the embodiment was used to generate a ceramic member from a mixture containing mica, a volume content of which was 90 volume %, and silicon dioxide, a volume content of which was 10 volume %, as main components. In Example 3, non-swelling mica same as that in Example 1 and Example 2 was applied and sintering was performed by the hot-press sintering method. Sintering conditions during the hot-press sintering were the same as those in Example 1 and Example 2. As in Example 1 and Example 2, in a sintered compact obtained by the sintering, measurement conforming to JIS R 1618 was performed in different temperature bands by using the test pieces 102 and 103 same as those explained above. A measurement result is shown in Table 3.

[Table 3]

TABLE 3

| Temperature (° C.) | Thermal Expansion Coefficient ($10^{-6}$/° C.) | |
| --- | --- | --- |
|  | Orientation Direction | Pressure Direction |
| To 100 | 4.32 | 11.75 |
| To 150 | 4.53 | 11.79 |
| To 200 | 4.73 | 12.04 |
| To 250 | 4.90 | 12.22 |

It is seen from this Table 3 that the thermal expansion coefficient in the orientation direction of the ceramic member was $4.0 \times 10^{-6}$ to $5.0 \times 10^{-6}$/° C. in all the temperature bands and attained a value close to the thermal expansion coefficient of silicon ($3.4 \times 10^{-6}$/° C.). On the other hand, the thermal expansion coefficient in a direction parallel to the pressure direction was about $11 \times 10^{-6}$ to $12 \times 10^{-6}$/° C. Therefore, as in Example 1 and Example 2, it was made clear that anisotropy concerning a thermal expansion coefficient was developed in the ceramic member according to Example 3.

In Example 3, as in Example 1 and Example 2, to check workability of a ceramic member, a ceramic member having thickness of 2.70 mm was formed from a sintered compact and one thousand through-holes were formed in a matrix shape in this ceramic member by a method same as that in Example 1. A diameter of the through-holes could be set to 160 μm (an aspect ratio was 2.70/0.160=16.9) and a hole pitch p could be set to 200 μm. As a result, ±5 μm could be attained as pitch accuracy. In this sense, it was confirmed that the ceramic member manufactured in Example 3 had workability equivalent to that of the ceramic members manufactured in Example 1 and Example 2.

The present invention can include various embodiments and examples not described herein. Various alterations and the like can be applied to the present invention within a range not departing from the technical idea specified by claims.

INDUSTRIAL APPLICABILITY

As explained above, in a micro contactor used for semiconductor inspection and liquid crystal inspection, the present invention is suitable as a material of a probe holder in which probes that electrically connect a circuit structure of an inspection target and a circuit structure for transmitting a signal for inspection are inserted.

The invention claimed is:

1. A ceramic member formed by sintering a mixture containing mica and silicon dioxide, in the mixture a volume content of the mica is 70 to 90 volume % and a volume content of the silicon dioxide is 10 to 30 volume %, and
   a thermal expansion coefficient at 20 to 250° C. in a direction parallel to a direction in which the mica is oriented is $3 \times 10^{-6}$ to $5 \times 10^{-6}$/° C., wherein the mica is orientated in mainly one direction to obtain a thermal expansion coefficient of $3 \times 10^{-6}$ to $5 \times 10^{-1}$/° C.

2. The ceramic member according to claim 1, wherein the mica is non-swelling mica.

3. A probe holder for housing probes made of a conductive material, comprising:
   through holes, into which the probes are to be inserted;
   a base material formed by using a ceramic member formed by sintering a mixture containing mica and silicon dioxide, in the mixture a volume content of the mica is 70 to 90 volume % and a volume content of the silicon dioxide is 10 to 30 volume %, the mica being oriented in one direction, and the through-holes being pierced in a direction crossing a direction in which the mica is oriented in the base material, wherein
   a thermal expansion coefficient at 20 to 250° C. in a direction parallel to a direction in which the mica is oriented is $3 \times 10^{-6}$ to $5 \times 10^{-6}$/° C., wherein the mica is orientated in mainly one direction to obtain a thermal expansion coefficient of $3 \times 10^{-6}$ to $5 \times 10^{-6}$/° C.

* * * * *